Figure 1:
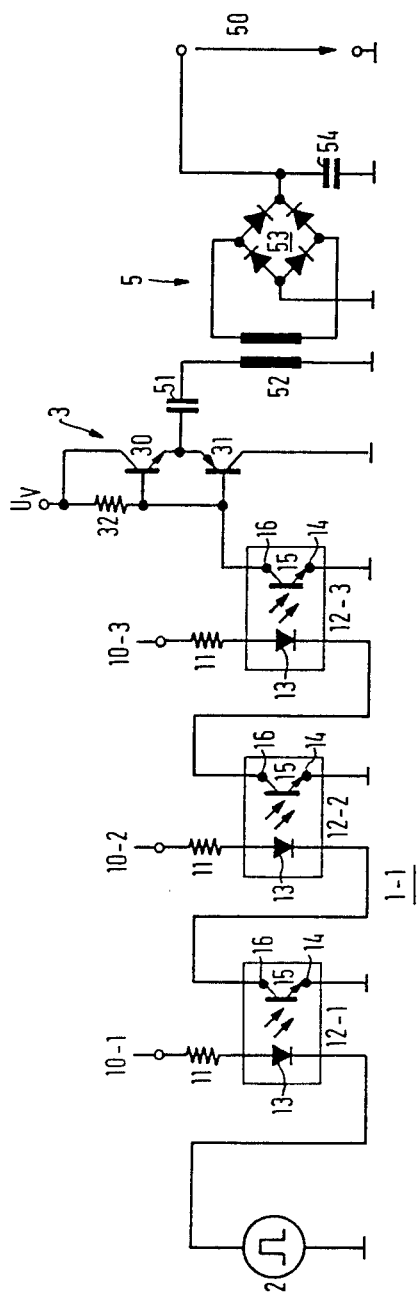

United States Patent [19]

Neumann et al.

[11] Patent Number: 4,731,528
[45] Date of Patent: Mar. 15, 1988

[54] FAILSAFE LOGIC CIRCUIT WHEREIN THE PHOTOTRANSISTOR OF A PRECEDING OPTOCOUPLER IS CONNECTED IN SERIES WITH THE PHOTODIODE OF A SUCCEEDING OPTOCOUPLER

[75] Inventors: Hans-Jürgen Neumann; Artur Meisberger, both of St. Wendel, Fed. Rep. of Germany

[73] Assignee: Fresenius AG, Bad Homburg, Fed. Rep. of Germany

[21] Appl. No.: 868,398

[22] Filed: May 28, 1986

[30] Foreign Application Priority Data

May 29, 1985 [DE] Fed. Rep. of Germany ....... 3519252

[51] Int. Cl.$^4$ ................... H01J 31/50; H01J 40/14
[52] U.S. Cl. .............................. 250/213 A; 250/551
[58] Field of Search .................... 250/213 A, 551; 364/713; 307/311

[56] References Cited

U.S. PATENT DOCUMENTS

| 2,895,054 | 7/1959 | Loebner | 250/213 A |
| 2,900,522 | 8/1959 | Reis | 250/213 A |
| 2,900,574 | 8/1959 | Kazan | 250/213 A |
| 2,907,001 | 9/1959 | Loebner | 250/213 A |
| 2,984,749 | 5/1961 | Ross | 250/213 A |
| 2,997,596 | 8/1961 | Vize | 250/213 A |
| 3,020,410 | 2/1962 | Bowerman | 250/213 A |
| 3,078,373 | 2/1963 | Wittenberg | 250/213 A |

Primary Examiner—David C. Nelms
Assistant Examiner—William L. Oen
Attorney, Agent, or Firm—Townsend and Townsend

[57] ABSTRACT

Failsafe logic circuits, for instance AND-, NOR-, NAND- and OR-circuits are devised at which at least one signal input is connected to a signal output via an optocoupler. Herewith dimensioning problems with respect to transistors and coupling capacitors as known from conventional failsafe logic circuits do not appear. Further on an optocoupler cannot fail in such a manner that between a photodiode and a phototransistor a galvanic coupling may arise.

6 Claims, 5 Drawing Figures $A = E1 + E2 + \ldots + En$ $$A = \overline{E1 \cdot E2 \cdot \ldots \cdot Er}$$

FAILSAFE LOGIC CIRCUIT WHEREIN THE PHOTOTRANSISTOR OF A PRECEDING OPTOCOUPLER IS CONNECTED IN SERIES WITH THE PHOTODIODE OF A SUCCEEDING OPTOCOUPLER

The invention relates to a failsafe logic circuit according to the preamble of claim 1 or 2.

Commonly in semiconductor circuits two kinds of faults, namely active and passive faults may appear. A passive fault is present if at failure of a component of an assembly the assembly changes over into a safe condition which is commonly a currentless condition. At the appearance of an active fault, however, the assembly remains active so that active faults during the operational condition cannot be recognized. At failsafe components it has to be taken care by a design measure that only passive faults may appear.

From the paper "Technische Information: Sicherheitstechnische Elektronische Steuerungen, LBM03-72, Paul Hildebrand GmbH & Co. KG in Industrieelektronik" a failsafe logic circuit is known from which the preamble of claim 1 departs. At the AND circuit described therein the logical signals to be combined are applied by means of resistors through the collectors of switching transistors. Within the admitted base circuit of the first switching transistor a squarewave voltage having a frequency of 8 kHz is applied. Therefore the first transistor is alternately switched with a frequency of 8 kHz into a current conducting and a current locking mode. If at the same time a logic "1", this means a high voltage level, is applied to the first signal input then an alternating current with a frequency of 8 kHz is flowing through the emitter collector circuit. The voltage drop produced thereby by means of a coupling capacitor is used for controlling a second switching transistor. If a logic "1" is also applied to the second signal input, then an alternating voltage via an amplifier stage and a separating capacitor is applied to an alternating current transformer. The voltage at the secondary side of this alternating current transformer is applied to a rectifier with a filter capacitor. At the output of this rectifier therefore only a high signal level or a logic "1", respectively appears, if both signal inputs of the failsafe logic circuit are fed by a logic "1" and the first switching transistor is fed by the alternating voltage. By means of this superposing of the logic signals with an alternating voltage and the DC decoupling of the output of the logic circuit from the combinatorial logic it is attained that a failure of a component which results in a static high signal level cannot appear at the output of the logic circuit. Herewith it is of importance that the capacitor coupling of the different switching transistors by means of resistors is dimensioned in such a way that by a failure of a component a voltage signal or a logic high level, respectively, cannot appear at the output of the logic circuit.

Detrimental at such a logic circuit is the necessity to have different components accurately dimensioned within certain tolerances which make the circuit more expensive since precise components must be used. Since, however, at the use of precise components certain tolerances must be tolerated it is possible that under certain unfavorable operational conditions the failsafe operation of the logic circuit is not guaranteed. Furtheron at a breakdown of the base collector circuit of the switching transistors the dynamic signal of a squarewave generator alone may erroneously cause a logic "1" at the output of the AND-cicuit. Furtheron it is detrimental that a transistor may fail in such a way that it provides a dynamic signal which again erroneously results in a high level output of the AND-circuit. Also reliability of such logic circuits is reduced due to the greater amount of used components in comparison to conventional logic circuits.

An improvement with respect to failsafety is achieved by the use of optocouplers as it is e.g. known from German published patent application DE-OS No. 24 25 904. However, there the periodic signal in the event of an AND-circuit forms one of the signals to be combined and in the event of an OR-circuit parallel circuits each must be activated by the periodic signal. Such a circuit device is detrimental if cascading is desired where according to a unitary circuit scheme a random number of signals may be logically combined.

It is therefore the object of the present invention to devise a failsafe logic circuit according to the preamble of claim 1 or 2, which in spite of the use of components with usual tolerances is failsafe, which shows an increased reliability and which is usable for a random number of signals to be combined which means that the circuit may be arranged in a cascade.

This object is achieved according to the characterizing features of claim 1 or 2.

Herewith it is of importance that within the combinatorial logic of the failsafe logic circuit optocouplers are used as coupling elements so that dimensioning problems are not present which otherwise appear at the use of transistors and coupling capacitors. At the same time the reliability of the failsafe logic circuit is increased since the amount of components is reduced. A main advantage resides in the fact that an optocoupler never can fail in such a way that between the photodiode and the phototransistor a galvanic coupling may arise. Also a dynamic failure is not possible at an optocoupler in contrast to a transistor. A failsafe logic circuit having an increased failsafety by means of optocouplers is very important in particular at the use of medical instruments which are directly connected to patients and therefore may be hazardous.

For implementing of a failsafe AND- or NOR-circuit the optocouplers advantageously are connected in series. For implementing of failsafe OR- or NAND-circuits the optocouplers are connected in parallel. If either the NAND-circuit or the NOR-circuit is implemented with only one signal input then two different types of failsafe inverters can be implemented.

According to a further advantageous embodiment the output signals of the combinatorial logic are amplified in an amplifier circuit which is of particular advantage in the event where e.g large loads are directly controlled.

In an advantageous manner the separating capacitor may be arranged downstream of the amplifier circuit which prevents that direct current components can be fed to the primary of the transformer. This separating capacitor also serves for protecting the switching transistors.

Figure 2:
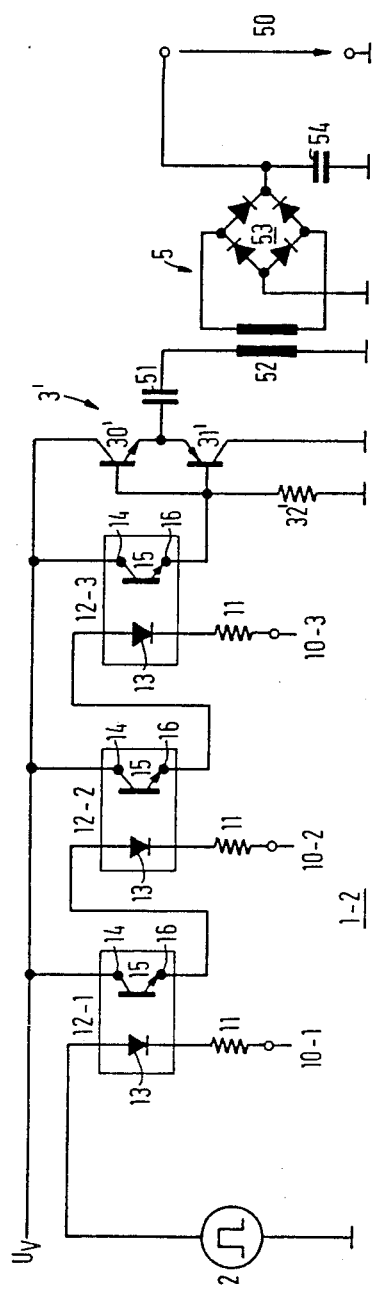
Figure 3:
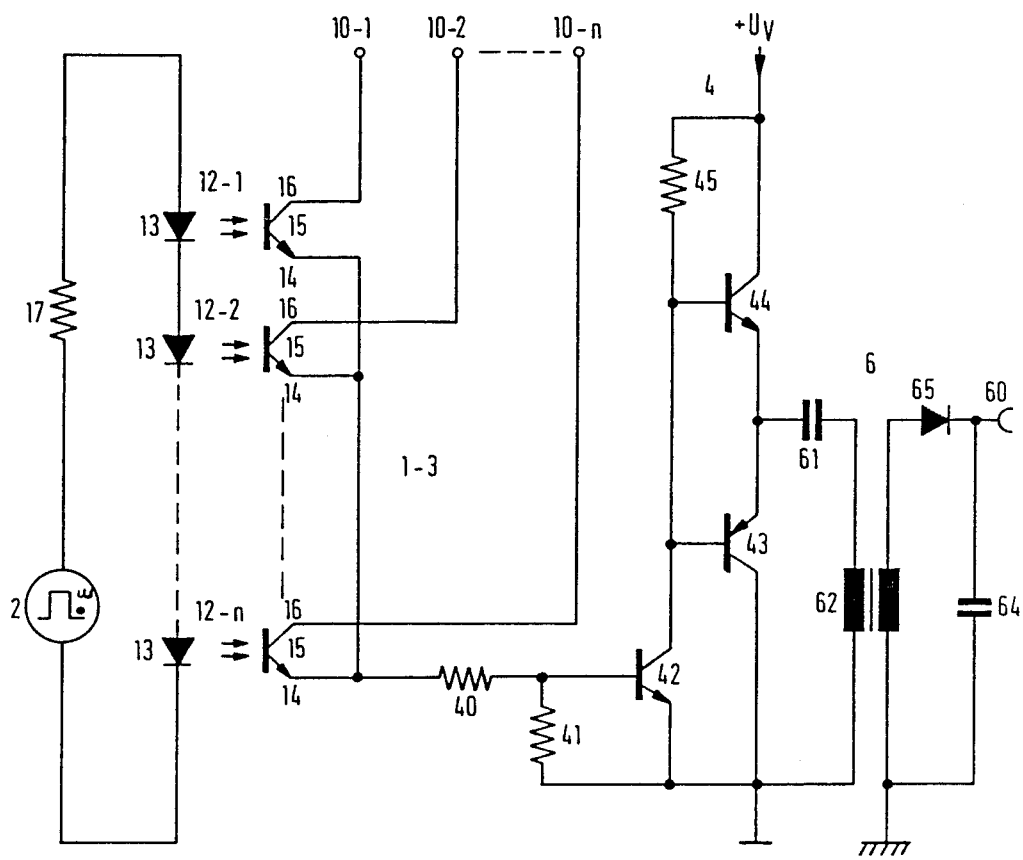
Figure 4:
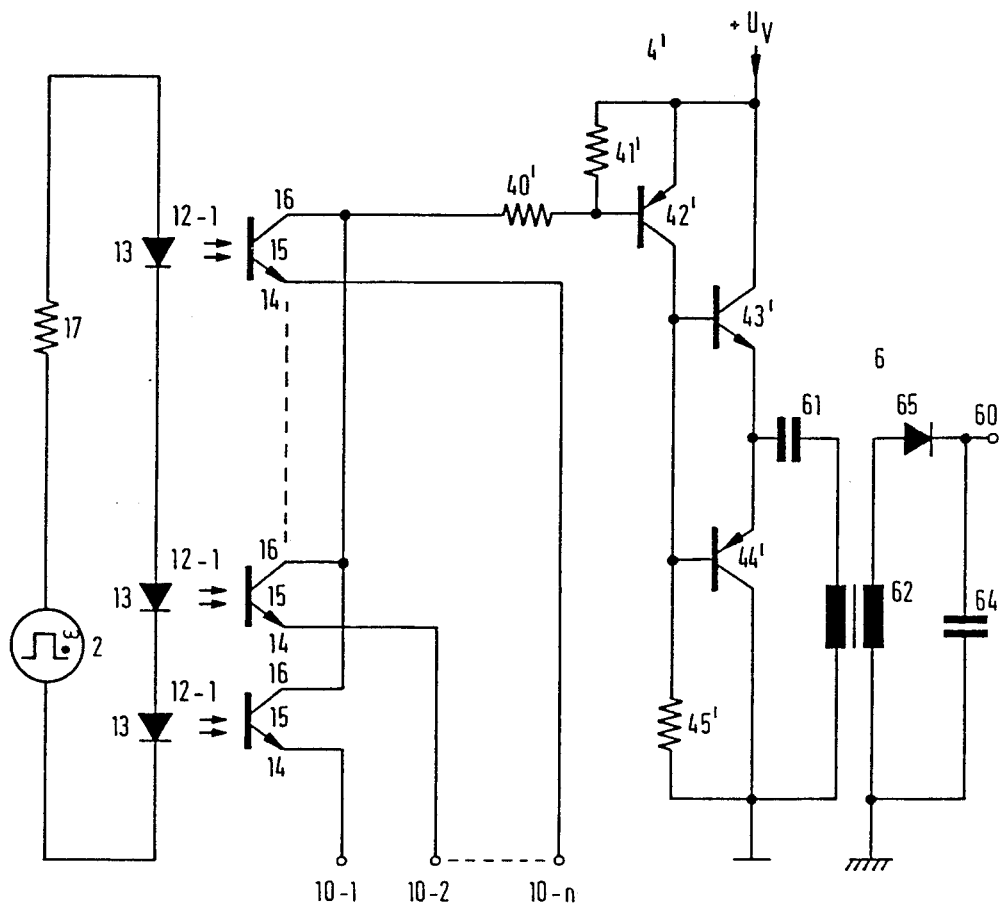

Further details, features and advantages of the invention result from the succeeding description of several embodiments of the invention with respect to the drawing. Therein shows:

FIG. 1 a failsafe AND-circuit according to the present invention;

FIG. 2 a failsafe NOR-circuit;

FIG. 3 a failsafe OR-circuit;
FIG. 4 a failsafe NAND-cicuit; and
FIG. 5 an alarm-resume circuit comprising an AND- and a NOR-cicuit.

FIG. 1 shows the circuit diagram of a failsafe AND-circuit for three input signals to be logically combined and comprising an AND-combinatorial logic 1-1, an alternating voltage source 2 implemented by a squarewave generator, an amplifier circuit 3, and an output circuit 5 responsive only to an alternating current. Three signals to be logically combined are applied via a first, a second and a third signal input 10-1, 10-2 and 10-3 and related resistors 11 to a first, second and third optocoupler 12-1, 12-2, 12-3 of the AND-combinatorial logic 1-1. The optocouplers 12-1, 12-2, 12-3 are forming the coupling elements of the AND-combinatorial logic 1-1. One output of the alternating voltage source 2 implemented by a squarewave generator is connected with a first connection of a photodiode 13 of the first optocoupler 12-1 and the other output of the alternating voltage source 2 is connected to ground. The second connection of the photodiode 13 of the first optocoupler 12-1 is connected by its related resistor 11 to the first signal input 10-1. An emitter connection 14 of a phototransistor 15 of the first optocoupler 12-1 is connected to ground and a collector connection 16 of the phototransistor 15 of the first optocoupler 12-1 is connected to the first connection of the photodiode 13 of the second optocoupler 12-2. The other connection of the photodiode 13 of the second optocoupler 12-2 is connected by its related resistor 11 to the second signal input 10-2. In the same manner collector-and emitter connections 14, 16 of the phototransistor 15 of the second optocoupler 12-2, the third signal input 10-3 with its related resistor 11 and the photodiode 13 of the third optocoupler 12-3 are connected.

The emitter connection 14 of the third optocoupler 12-3 also is connected to ground and the collector connection 16 of the third optocoupler 12-3 is connected to the base connections of a first and a second transistor 30 and 31 of the amplifier circuit 3. A supply voltage U$_V$ is connected to a resistor 32 and a collector of the transistor 30. A further connection of the resistor 32 is connected to the bases of the transistors 30, 31 and to the collector connection 16 of the third optocoupler 12-3. The emitter connections of the transistors 30, 31 which represent the output of the amplifier circuit 3 are connected to a separating capacitor 51 of the output circuit 5. The other connection of the separating capacitor 51 is connected to the primary side of an alternating current transformer 52. The secondary side of the transformer 52 is connected to a rectifier 53 implemented by a bridge rectifier and having a filter capacitor 54. The output of the bridge rectifier 53 forms the output 50 of the failsafe AND-circuit.

If now the alternating voltage source 2 is switched on and if at the same time a logic high level, this means the supply voltage U$_V$ is supplied to the first signal input 10-1, then the photodiode 13 of the first optocoupler 12-1 emits a light with a frequency of the alternating voltage source 2. If this light impinges on the phototransistor 15 of the first optocoupler 12-1, this phototransistor comes in a current conducting state. If now at the same time a high signal level or a logic "1" is supplied to the second signal input 10-2 of the AND combinatorial logic 1-1 an alternating current having the frequency of the alternating voltage source 2 is flowing via the resistor 11, the photodiode 13 of the second optocoupler 12-2 and the phototransistor 15 of the first optocoupler 12-1 so that the photodiode 13 of the second optocoupler 12-2 also emits a light with a frequency of the alternating voltage source 2. In the same manner the photodiode 13 of the third optocoupler 12-3 emits light if a logic "1" is presented to the third signal input 10-3 of the AND combinatorial logic 1-1. This alternating light causes an alternating current flowing via the phototransistor 15 of the third optocoupler 12-3. This alternating current is amplified by the amplifier circuit 3 and then fed to the transformer 52 via the separating capacitor 51. The voltage produced at the secondary side of the transformer 52 is rectified within the rectifier 53 and is smoothed by the filter capacitor 54 so that at the output 50 of the failsafe logic circuit a direct current signal is present which represents a high logic level or a logic "1", respectively. At the output 50 of the failsafe AND-circuit therefore only a DC voltage level and therefore a logic "1" is present if the alternating voltage source 2 provides an alternating voltage and if at the signal inputs 10-1, 10-2 and 10-3 of the AND combinatorial logic 1-1 each a logic "1" is present which only is the case if no component has failed.

FIG. 2 shows a second embodiment of the present invention, namely a failsafe NOR-circuit. The same components of the failsafe NOR-circuit show the same reference numerals as those components within the AND-circuit according to FIG. 1. The collector connections 14 of the phototransistors 15 of the optocouplers 12-1, 12-2, 12-3 and an amplifier circuit 3' are parallel connected to the supply voltage U$_V$. One connection of the photodiodes 13 each is connected to the signal inputs 10-1, 10-2, 10-3 of a NOR combinatorial logic 1-2. The other connection of the photodiode 13 of the first optocoupler 12-1 is connected to an output connection of an alternating voltage source 2 implemented as a squarewave generator and the other output connection of this alternating voltage source 2 is connected to ground. The emitter connections 16 of the phototransistors 15 of the first and second optocouplers 12-1 and 12-2 are connected to a connection of the photodiodes 13 of the second and third optocouplers 12-2 and 12-3. The emitter connection 16 of the phototransistor 15 of the third optocoupler 12-3 is connected to the base connections of the first and second transistor 30' and 31' and to a connection of a resistor 32' of the amplifier circuit 3'. The design of the amplifier circuit 3' essentially equals the design of the amplifier circuit 3 of the failsafe AND-circuit according to FIG. 1, whereat only the polarity is exchanged.

The level of the positive supply voltage U$_V$ represents the high logic level "1" and a voltage of 0 volt or ground, respectively, represents the logic level "0". If the alternating voltage source 2 provides an alternating voltage, an alternating current only can flow via the photodiode 13 of the first optocoupler 12-1, if at the first signal input 10-1 of the NOR combinatorial logic 1-2 a logic "0" is presented. If at the first input signal 10-1 a logic "1" would be present then the photodiode 13 of the first optocoupler 12-1 would be non-conducting. The light emitted by the photodiode 13 of the first optocoupler 12-1 blocks the phototransistor 15 of the first optocoupler 12-1 so that via this phototransistor and the photodiode 13 of the second optocoupler 12-2 an alternating current is flowing, if at the second signal input 10-2 of the NOR combinatorial logic 1-1 a logic "0" is presented. In the same manner via the phototransistor 15 of the third optocoupler 12-3 a current may flow, if at the third signal input 10-3 of the NOR combinatorial logic 1-2 a logic "0" is presented. The voltage drop caused by the current over the phototransistor 15 of the third optocoupler 12-3 is amplified by the amplifier circuit 3' and is fed via the separating capacitor 51 to the primary side of the transformer 52. The voltage induced on the secondary side of the transformer 52 is rectified by the rectifier 53 and is smoothed by the filter capacitor 54 so that at the output 50 of the failsafe logic circuit a direct voltage signal as a logic "1" is present.

FIG. 3 shows a further embodiment of the present invention whereat the combinatorial logic is implemented as an OR-logic 1-3. The alternating voltage source 2 is directly connected via a resistor 17 to the series connection of the photodiodes 13 of the first, second to $n^{th}$ optocoupler 12-1, 12-2 to 12-n. The collector connections 16 of the optocouplers 12-1, 12-2 . . . 12-n are directly connected to the signal inputs 10-1, 10-2 . . . 10-n of the OR combinatorial logic 1-3. The emitter connections of the phototransistors 15 or the optocouplers 12-1, 12-2 . . . 12-n are directly connected to a connection of a first resistor 40 of an amplifier circuit 4. The other connection of the resistor 40 is connected to a connection of a second resistor 41 and to the basis connection of a first transistor 42. A collector connection of the first transistor 42 is connected to base connections of second and third transistors 43, 44 and to a connection of a third resistor 45. The other connection of the third resistor 45 as well as the collector connection of the third transistor 44 is connected to a supply voltage $U_V$. A connection of the second resistor 41 together with the emitter connection of the first transistor 42 and the collector connection of the second transistor 43 is connected to ground. The emitter connections of the third and second transistor 44 and 43 are connected via a separating capacitor 61 to an output circuit 6 of the failsafe OR-circuit with said output circuit only being responsive to an alternating voltage. The other connection of the separating capacitor 61 is connected to the primary winding of a transformer 62. The secondary side of the transformer 62 is connected via a diode 65 and a filter capacitor 64 to the output 60 of the failsafe OR-circuit.

If the circuit comprising the alternating voltage source 2, the resistor 17 and the series connection of the diodes 13 is supplied with an alternating voltage of the frequency $f_0$ then the optocouplers 12-1, 12-2 . . . 12-n are periodically switched with the frequency $f_0$. If at the same time at least one of the signal inputs 10-1, 10-2 . . . 10-n is supplied with a high logic level, then at least an alternating current having the frequency $f_0$ is flowing via one of the phototransistors 15 and the voltage drop resulting therefrom at the second resistor of the amplifier circuit 4 is amplified within the amplifier circuit 4 and is fed via the separating capacitor 61, the transformer 62, the diode 65 and the filter capacitor 64 to the output 60 of the failsafe OR-circuit.

FIG. 4 shows a failsafe NAND-circuit having a NAND combinatorial logic 1-4. The NAND combinatorial logic 1-4 differs from the OR combinatorial logic 1-3 according to FIG. 3 only by the fact that instead of the collector connections 16 or the phototransistors 15 of the optocouplers 12-1, 12-2 . . . 12-n the emitter connections 14 of the phototransistors 15 are directly connected to the signal inputs 10-1, 10-2 . . . 10-n whereas the collector connections 16 of the optocouplers instead of the emitter connections 14 are connected to an amplifier circuit 4'. The design of the amplifier circuit 4' having first, second and third resistors 40', 41', 45' and first, second and third transistors 42', 43' and 44' corresponds to the amplifier circuit of the OR-circuit according to FIG. 3 and is only matched to the different polarity of the signals. The output circuit 5 of the NAND-circuit according to FIG. 4 is identical to the output circuit of the OR-circuit according to FIG. 3.

Furtheron the operation of the NAND combinatorial logic 1-4 corresponds the operation of the OR combinatorial logic 1-3; only the polarity of the signals is inverted.

If the NAND combinatorial logic 1-4 or the NOR combinatorial logic 1-2 are operated only with one signal input then two possibilities for the implementation of a failsafe inverted are given.

At all cited logic basic circuits according to FIGS. 1 to 4 it is made sure that at the failure of any component the logic circuit takes the safe condition, this means at the output of the logic circuit a low voltage level or a logic "0" respectively is present. By an according dimensioning of the output circuit which is only responsive to an alternating current and by the use of a high clock frequency $f_0$ of the alternating voltage source it is attained that an alternating voltage with a line frequency cannot achieve an active condition or a logic "1" respectively at the output of the logic circuit. The transformer in the output circuit is designed in such a way that no conducting connection can arise between primary and secondary winding. For instance, the two windings are separated in space so that only an inductive coupling is possible. Also by an according isolating winding it can be achieved that between the primary and secondary side of the transformer no galvanic connection can arise.

The optocouplers are designed in such a way that at defects never a galvanic connection can arise between photodiode and phototransistor. At the electric circuit design shorts and breakdowns are prevented with a great likelihood by providing a sufficient distance between the conducting tracks, by a ground track between two potential leading tracks and by providing the printed board by an isolating stop-off lacquer.

Under consideration of these design measures it is nearly impossible that at failure of any component within the failsafe logic circuit a logic "1" may appear at the output. For instance, no alternating voltage can attain the alternating current transformer 37, so that at the output a logic "0" is present, if
one of the resistors is unsoldered,
one of the resistors becomes highly resistive,
a photodiode fails so that permanently light is emitted,
a photodiode fails so that no light is emitted,
one of the transistors is shorted,
one of the transistors in the transmission circuit becomes highly resistive,
the supply voltage $U_V$ breaks down.

At the output of the failsafe logic circuit also a logic "0" is presented, if at the primary side or at the secondary side of the transformer windings are shorted, the rectifier becomes defect, the filter capacitor is shorted etc.

If one uses optocouplers having a current transmission greater than 1, then essentially more than three combinatorial stages may be implemented. A particular advantage at the use of optocouplers at failsafe logic circuits according to the present invention resides in the fact that from stage to stage or from optocoupler to optocoupler, respectively, no attenuation of the signal appears.

Failsafe logic circuits according to the present invention with particular advantages may be used for functional alarm tests of safety devices or medical instruments, in particular at dialysis machines or similar devices, as e.g. a cell separator.

Figure 5:
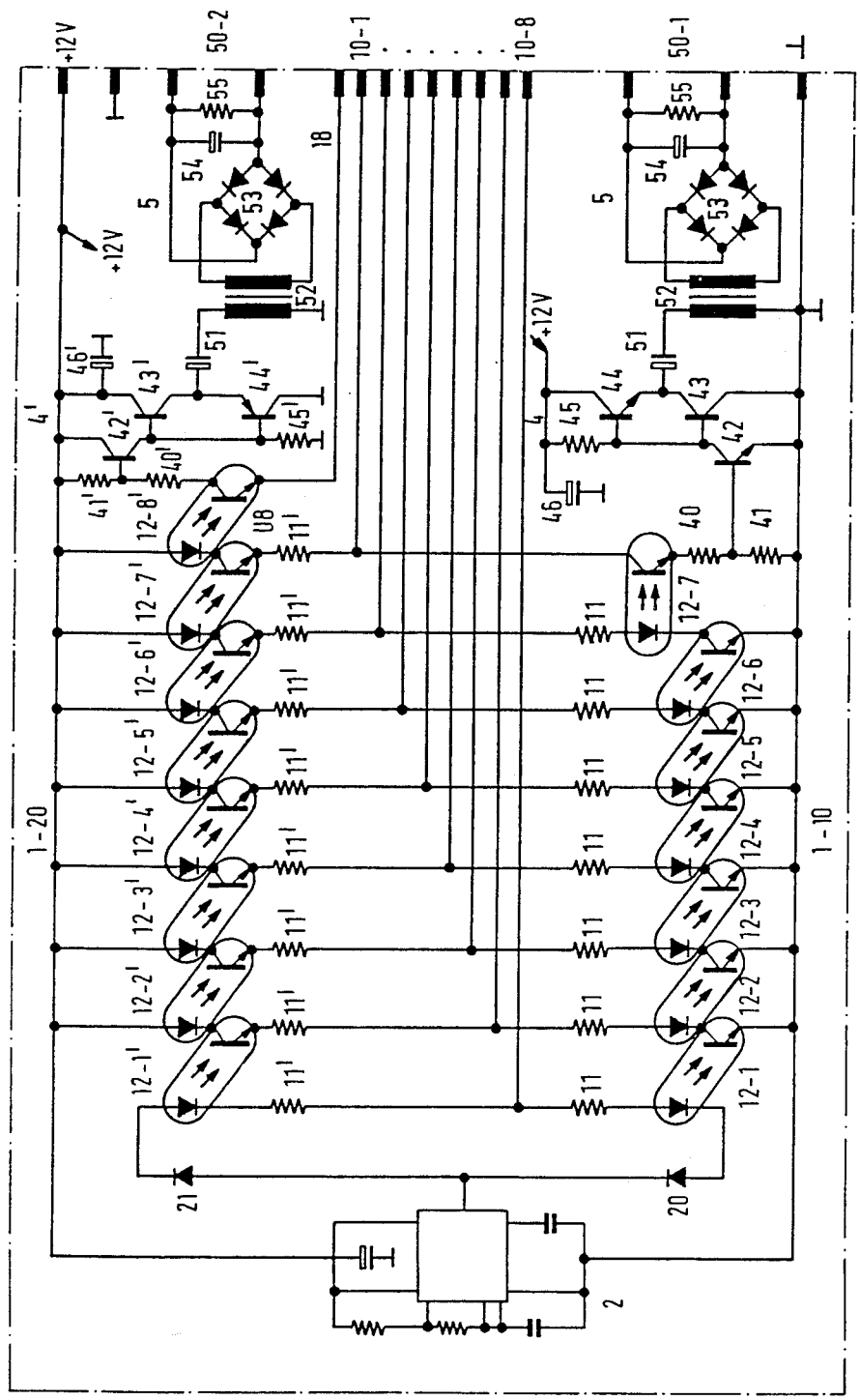

FIG. 5 shows an alarm resume for a cell separator comprising a failsafe AND circuit 1-10 and a failsafe NOR cicuit 1-20 for eight signals to be logically combined. Those signals are applied to signal inputs 10-1 to 10-8 and they are fed via resistors 11 or 11', respectively, to the optocouplers 12-1' to 12-1' of the NOR combinatorial logic 1-20 and to optocouplers 12-1 to 12-8 of the AND combinatorial logic 1-10. The AND combinatorial logic 1-10 corresponds to the AND combinatorial logic 1-1 according to FIG. 1. The NOR combinatorial logic 1-20 differs from the NOR combinatorial logic according to FIG. 2 only by the fact that within the series connection of the optocouplers the signal to be logically combined is first applied to the phototransistors of the optocouplers and not first to the photodiodes of the optocouplers.

Furtheron the NOR combinatorial logic 1-20 comprises a signal output 18 for the connection of an optical display. The optocoupler U8 used to this end provides no emitter output signal for the display in the event where only one of the signal connections 10-1 to 10-8 receives a high level which represents an error.

The amplifier circuit 4' connected to the NOR combinatorial logic 1-20 equals to the amplifier circuit according to FIG. 4 with the exception that a capacitor 46' is arranged between the collector of the first transistor 42' and ground. The amplifier circuit 4 connected to AND combinatorial logic 1-10 equals to the amplifier circuit 4 according to FIG. 3 with the exception that between ground and the collector connection of the third transistor 44 a capacitor 46 is arranged. The output circuit 5 connected to the amplifier circuits 4' and 4 are identical to the output circuits according to FIGS. 1 and 2, whereat a resistor 45 additionally is arranged in parallel to the output.

The AND combinatorial logic 1-10 as well as the NOR combinatorial logic 1-20 are fed by the alternating voltage source 2 via diodes 20 and 21 to receive the necessary alternating voltage. Under operational conditions the signal inputs 10-1 to 10-8 of the alarm resume circuit of the cell separator according to FIG. 5 are connected to the alarm circuits of the safety devices to be monitored. Those alarm circuits provide a logic "1", if the monitored components are switched-on for fault checking.

For checking the alarm circuits at medical instruments before the start of any treatment a functional alarm test must be made. To this end portions of the instruments which are monitored by the alarm circuits are brought into conditions at which all alarm circuits must respond so that the logic level a all signal inputs 10-1 to 10-8 has to rise from logic "0" to logic "1". Herewith the output signal 50-1 of the output circuit of the AND combinatorial logic 1-10 also must rise from logic "0" to logic "1" which indicates that all alarm circuits are functional. At change-over to the normal mode all signal inputs 10-1 to 10-8 are set to the logic level "0". This activates the NOR-circuits and the display at the signal output 18 indicates a proper operation.

If, however, a defect appears, e.g. a broken conductor track, then the output signal of the related alarm circuit rises to the logic level "1". Under normal operation conditions of the cell separator all signal inputs 10-1 to 10-8 show a logic "0", so that at the output 50-1 of the output circuit of the AND combinatorial logic 1-10 a logic "0" and at the output 50-2 of the NOR-circuit a logic "1" is present. If one of the signal inputs would have a logic "1" instead of a logic "0", the output signal at the output 50-1 of the output circuit of the AND combinatorial logic 1-10 would rise from logic "0" to logic "1" and at the output 50-2 of the NOR-circuit would appear a logic "0" which has to be interpreted as alarm.

Of course, the logic level at the signal input for each desired application can show a high level instead of a low level. In this event the signal inputs of the failsafe logic circuits are connected to the alarm circuits of the safety devices to be monitored. Those alarm circuits provide a logic "1", if the monitored components operate without faults. If a defect appears which defect may be e.g. a broken conductor track then the output signal of the corresponding alarm circuit decreases to logic "0". Under normal operational conditions the outputs of those alarm circuits are connected to the signal inputs of the failsafe AND-circuit at which a lowering of the output signal from logic "1" to logic "0" is interpreted as an alarm. For the checking of the alarm circuits at medical instruments before starting a treatment a functional alarm test must be conducted. To this end the outputs of the alarm circuits are connected to the signal inputs of the failsafe NOR-circuit. Then the medical instrument is operated under conditions at which all alarm circuits must respond so that the logic level at all signal inputs of the failsafe NOR-circuit has to decrease from logic "1" to logic "0". If this condition appears at all connected alarm circuits, then the logic level at the output of the NOR-circuit changes from logic "0" to logic "1" which indicates that all alarm circuits operate well.

We claim:

1. Failsaft AND or NOR logic circuit comprising:
a combinatorial logic circuit having at least one signal input and only one ultimate signal output, said combinatorial logic circuit including optocouplers as coupling elements by which said at least one signal input of said combinatorial logic circuit is connected with said ultimate signal output according to the implemented logic circuit;
an alternating voltage source connected to said combinatorial logic circuit to activate the combinatorial logic circuit according to said alternating voltage; and
an AC signal conductive component responsive to said alternating voltage and connected to the output of said combinatorial logic circuit for passing only alternating current signals;
wherein one optocoupler is provided per signal input whereat the signal inputs of said combinatorial logic circuit are applied to the cathodes or anodes of photodiodes of said optocouplers, each said optocoupler having a single transmitter and a single receiver and being unrestricted as to control frequency of timed input pulses;
wherein said optocouplers are arranged in a series circuit with the phototransistor of a preceding optocoupler being in a series connection with the photodiode of a succeeding optocoupler; and
wherein the photodiode of the first optocoupler is fed by the alternating voltage of said alternating voltage source and the phototransistor of the last optocoupler provides the ultimate signal output of the combinatorial logic.

2. Failsafe AND or NOR logic circuit comprising:
a combinatorial logic circuit having at least one signal input and only one ultimate signal output, said combinatorial logic circuit including optocouplers as coupling elements by which said at least one signal input of said combinatorial logic circuit is connected with said ultimate signal output according to the implemented logic circuit;
an alternating voltage source connected to said combinatorial logic circuit to activate the combinatorial logic circuit according to said alternating voltage; and
an AC signal conductive component responsive to said alternating voltage and connected to the output of said combinatorial logic circuit for passing only alternating current signals;
wherein one optocoupler is provided per signal input whereat the signal inputs of said combinatorial logic circuit are applied to the collectors or emitters of phototransistors of said optocouplers, each said optocoupler having a single transmitter and a single receiver and being unrestricted as to control frequency of timed input pulses; and wherein
said phototransistors of said optocouplers are arranged in a parallel circuit and said photodiodes of said optocouplers are arranged in a series connection with respect to each other and to the alternating voltage source.

3. Failsafe logic circuit according to claim 1 or 2, further comprises an AC responsive output circuit connected via an amplifier circuit to the output of the combinatorial logic circuit.

4. Failsafe logic circuit according to claim 3 further including an isolation capacitor between the combinatorial logic circuit and AC responsive output circuit means.

5. Failsafe logic circuit according to claim 4, wherein the AC responsive output circuit means comprises rectifier means.

6. Failsafe logic circuit according to claim 1, 2 or 5 characterized by a tandem arrangement of an AND and a NOR circuit to which the signal inputs are commonly connected, said tandem arrangement comprising an indicator optocoupler as the last optocoupler of the chain serving for signal transmission to the AC responsive component as well as for alarm indication.

* * * * *